United States Patent
Ramsden

(10) Patent No.: US 6,809,674 B1
(45) Date of Patent: Oct. 26, 2004

(54) ANALOG-TO-DIGITAL CONVERTERS

(75) Inventor: Edward A. Ramsden, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/687,468

(22) Filed: Oct. 15, 2003

(51) Int. Cl.[7] ............................................. H03M 1/12
(52) U.S. Cl. ..................................... 341/155; 341/141
(58) Field of Search ................................ 341/141, 155, 341/161, 162, 163

(56) References Cited

U.S. PATENT DOCUMENTS

| | | | | |
|---|---|---|---|---|
| 3,153,142 A | * | 10/1964 | Hellerman | 341/165 |
| 4,454,500 A | * | 6/1984 | Kato et al. | 341/108 |
| 5,760,721 A | * | 6/1998 | Inoue | 341/141 |
| 6,166,586 A | * | 12/2000 | Sanchez et al. | 327/538 |

* cited by examiner

Primary Examiner—Howard L. Williams
(74) Attorney, Agent, or Firm—MacPherson Kwok Chen & Heid LLP; Greg J. Michelson

(57) ABSTRACT

Systems and methods are disclosed to provide threshold detection and successive approximation analog-to-digital conversion. For example, in accordance with an embodiment of the present invention, a circuit is disclosed that provides successive approximation analog-to-digital conversion and high-speed threshold detection operations by utilizing common hardware resources.

15 Claims, 3 Drawing Sheets

ANALOG-TO-DIGITAL CONVERTERS

TECHNICAL FIELD

The present invention relates generally to electrical circuits and, more particularly, to analog-to-digital converters.

BACKGROUND

A successive approximation analog-to-digital converter (ADC) is commonly employed for applications that require low-power consumption and/or high resolution but that do not require high sampling rates. However, some applications may also require high-speed threshold detection in addition to the slower analog-to-digital (A/D) conversion of the successive approximation ADC.

For these applications, the high-speed threshold detection is performed by hardware that is separate from the successive approximation ADC, which results in duplicated functionality and may result in calibration inconsistencies between the hardware performing the high-speed threshold detection and the hardware performing the successive approximation ADC. Consequently, valuable circuit space is consumed and calibration issues may arise for the hardware employed for these applications. As a result, there is a need for improved techniques for providing threshold detection and A/D conversion.

SUMMARY

Systems and methods are disclosed herein to provide A/D conversion and threshold detection. For example, in accordance with an embodiment of the present invention, a circuit is disclosed that provides successive approximation A/D conversion and high-speed threshold detection (e.g., comparison) operations by utilizing common hardware resources. Consequently, the circuit may require less circuit space than a conventional circuit having a successive approximation ADC and a separate threshold detector. Furthermore, the circuit may maintain a more consistent calibration (e.g., calibration registration) between the successive approximation ADC and threshold detection operations than the conventional circuit.

More specifically, in accordance with one embodiment of the present invention, a circuit includes a comparator adapted to receive a first and a second input signal and provide a comparator output signal; a first register adapted to store at least one threshold value and at least one successive approximation register value; a digital-to-analog converter adapted to provide the second input signal to the comparator, where the second input signal is based on one of the threshold values or one of the successive approximation register values from the first register; and a second register adapted to store the comparator output signal from the comparator, wherein the circuit is adapted to provide threshold detection or successive approximation analog-to-digital conversion of the first input signal.

In accordance with another embodiment of the present invention, a circuit includes a comparator adapted to receive a first and a second input signal and provide a comparator output signal; means for providing the first input signal to the comparator; and means for storing and selecting one from a number of threshold values and one or more successive approximation register values to generate the second input signal to the comparator.

In accordance with another embodiment of the present invention, a method of providing analog-to-digital conversion and threshold detection includes providing a first input signal; selecting a threshold value or a successive approximation register value to convert and provide as a second input signal; comparing the first input signal to the second input signal to provide a comparator output signal; providing the comparator output signal as a threshold detector result if one of the threshold values was selected; and providing the comparator output signal as a comparison result for successive approximation analog-to-digital conversion if the successive approximation register value was selected.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
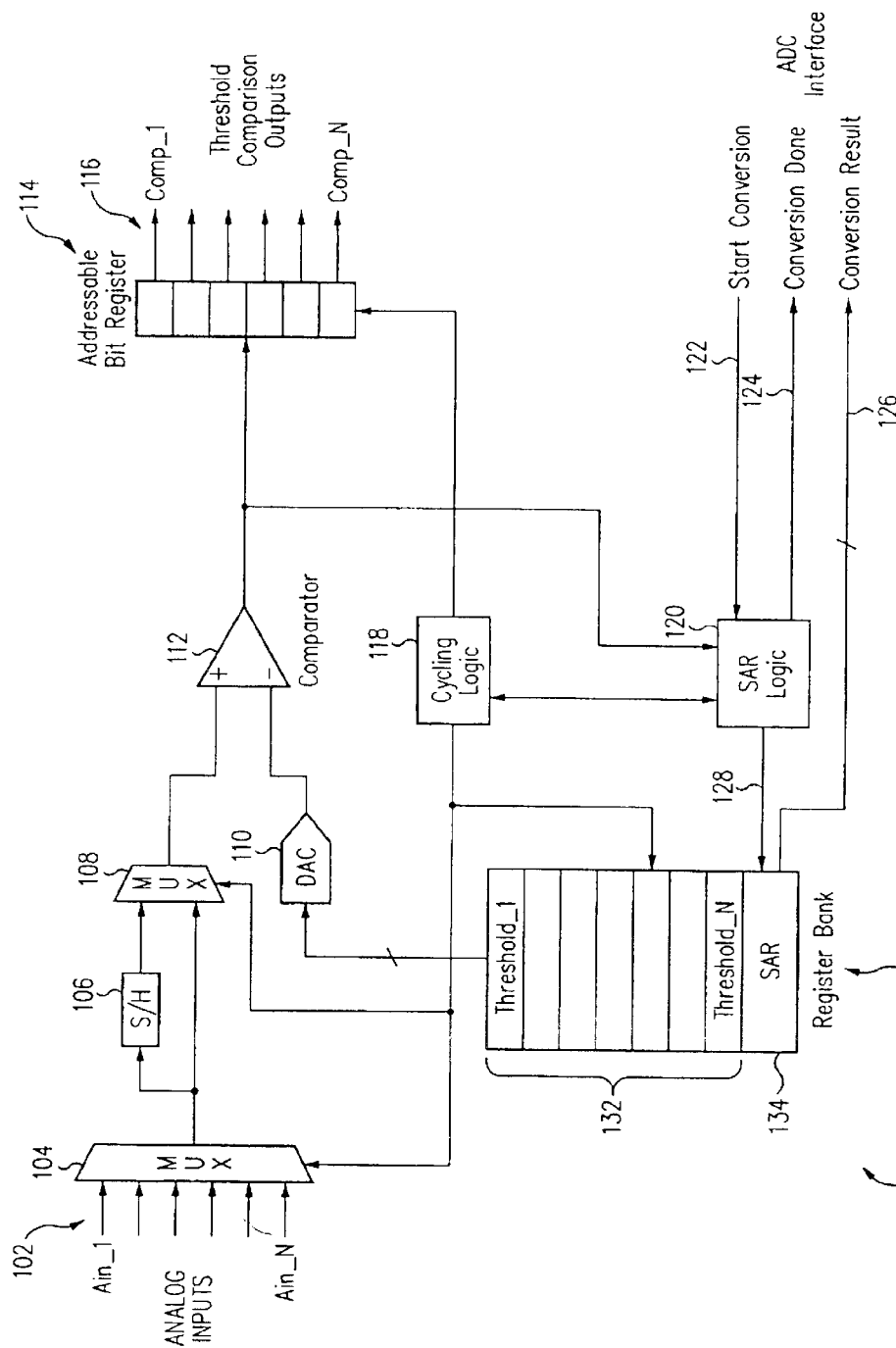
FIG. 1 shows a block diagram illustrating a circuit in accordance with an embodiment of the present invention.

FIG. 1 shows a block diagram illustrating a circuit 100 in accordance with an embodiment of the present invention. Circuit 100 provides successive approximation analog-to-digital A/D conversion and threshold detection by utilizing common hardware for the operations.

Circuit 100 includes multiplexers 104 and 108, a sample and hold (S/H) circuit 106, a digital-to-analog converter (DAC) 110, a comparator 112, registers 114 and 130, a cycling logic 118, and a successive approximation register (SAR) logic 120. Multiplexer 104 is capable of receiving a number of input signals 102 (e.g., analog signals Ain_1 through Ain_N, where N≧2) and selecting one of input signals 102, under control of cycling logic 118, to allow through to S/H circuit 106 and multiplexer 108.

Multiplexer 10B is controlled by cycling logic 118 to select an output signal from multiplexer 104 or S/H logic 106 to provide to comparator 112 (e.g., a high-speed operational amplifier or differential amplifier). Comparator 112 provides a comparator output signal to register 114 and to SAR logic 120. Register 114 may represent a number of addressable bit registers (e.g., a multiplexed output bit register), under control of cycling logic 118, to store the comparator output signals and provide as output signals 116 (e.g., threshold comparison output signals Comp_1 through Comp_N, where N≧2).

Register 130 may represent a register bank to store a number of thresholds 132 (e.g., threshold values Threshold_1 through Threshold_N, where N≧2) and at least one successive approximation register (SAR) 134. The number of input signals 102, output signals 116, and thresholds 132 may be the same number (i.e., where the value of 'N' for each is the same) or the number of input signals 102, output signals 116, and thresholds 132 may be independent and not necessarily corresponding to one another (i.e., where the value of "N" for each may be different). Thresholds 132 and SAR 134 provide their values to DAC 110, under control of cycling logic 118, with DAC 110 providing a reference signal to comparator 112.

Cycling logic 118 controls the operation of circuit 100. For example, cycling logic 118 selects one of input signals 102 to route through multiplexer 104, which signal from multiplexer 104 and S/H circuit 106 to route to comparator 112 via multiplexer 108, and which threshold 132 or value from SAR 134 to provide to DAC 110. Comparator 112 compares its input signals received from multiplexer 108 and DAC 110 and provides the comparator output signal (e.g., a TRUE/FALSE result).

If one of thresholds 132 was provided to DAC 110 (i.e., circuit 100 utilized as a comparator or also referred to as a threshold detector), then the output signal from comparator 112 is stored in one of the locations of register 114 under control of cycling logic 118. If a value from SAR 134 was provided to DAC 110 (i.e., circuit 100 utilized as a successive approximation ADC), then the output signal from comparator 112 is provided to SAR logic 120.

SAR logic 120 and cycling logic 118 communicate with each other so that, for example, SAR logic 120 knows when to use a result provided by comparator 112 for the successive A/D conversion. Cycling logic 118 is also notified, for example, by SAR logic 120 when a successive approximation A/D conversion is ready to begin or has been completed.

A successive approximation A/D conversion is initiated by circuit 100 when a start conversion signal 122 is asserted and provided to SAR logic 120. SAR logic 120 determines the value provided by SAR 134 to DAC 110 during the A/D conversion, with this value changed during the A/D conversion (i.e., successive approximation) based on the output signals provided by comparator 112 to SAR logic 120. When the successive approximation AD conversion is completed (depending upon the number of bits of SAR 134), a conversion result signal 126 is provided by SAR 134, which contains the result of the successive approximation A/D conversion. A conversion done signal 124 is also provided by SAR logic 120, which indicates whether the result provided by conversion result signal 126 is valid.

It should be understood that circuit 100 may be employed as a threshold comparator or as successive approximation ADC or employed for both types of operations (e.g., an ADC with threshold-comparison output signals). For example, circuit 100 may be used as a comparator, with cycling logic 118 selecting the desired input signal 102, selecting the desired threshold 132 for comparison purposes, and determining where to store the resulting output signal (e.g., a TRUE/FALSE result) from comparator 112 in register 114 for eventual output as one of output signals 116. Cycling logic 118 may then repeat this sequence for the next desired input signal 102, with this process repeated, for example, in a cyclic or sequential fashion among two or more of input signals 102. The frequency that cycling logic 118 selects each input signal 102 may also differ among input signals 102 in the cycle.

Alternatively, for example, circuit 100 may be used as a successive approximation ADC, with cycling logic 118 selecting the desired input signal 102 to sample and store in S/H circuit 106 and route via multiplexer 108 to comparator 112 and providing a value (determined by SAR logic 120) from SAR 134 to DAC 110 for each successive approximation of the A/D conversion. It should be understood that input signal 102 utilized for the A/D conversion does not have to be stored in S/H circuit 106, but could be routed directly to comparator 112 for each successive approximation of the A/D conversion. Thus, for some applications, S/H circuit 106 and multiplexer 108 may not be required.

Cycling logic 118 may also sequence through successive approximation A/D conversion and threshold comparator operations in any desired manner. For example, cycling logic 118 may have a major cycle that includes a number of comparison minor cycles (i.e., each input signal 102 for comparison) and a successive approximation A/D conversion minor cycle (i.e., developing one or more bits of the A/D conversion during the minor cycle).

As an example, cycling logic 118 selects one of input signals 102, loads the desired threshold 132 into DAC 110, and stores the corresponding result into register 114 to complete the minor cycle. Cycling logic 118 then proceeds to the next desired input signal 102 for the next minor cycle of the major cycle, with this process continuing through the minor cycles of the major cycle. If start conversion signal 122 is asserted, cycling logic 118 may employ S/H circuit 106 to sample and hold the value of the desired input signal 102 and the A/D conversion process is added to the major cycle as one of the minor cycles.

Consequently, during the minor cycle for the A/D conversion for each pass through the major cycle, a value of SAR 134 is compared to the value stored in S/H circuit 106, with the result from comparator 112 used by SAR logic 120 to modify the value stored in SAR 134 for use in the next minor cycle to perform successive (or partial) A/D conversion. When the A/D conversion is completed, SAR logic 120 asserts conversion done signal 124 and SAR 134 provides the converted data (based on the value of the selected input signal 102 stored in S/H circuit 106) via conversion result signal 126.

For example, if a major cycle of cycling logic 118 includes four input signals 102 (e.g., input signals 102(1) through 102(4)), with each input signal 102 to be compared to a threshold and input signal 102(3) also providing the signal for A/D conversion, a major cycle (with minor cycles numbered) may be as follows. First (first minor cycle), input signal 102(1) is compared to threshold 132(1), with the result stored in register 114(1). Next (second minor cycle), input signal 102(2) is compared to threshold 132(2), with the result stored in register 114(2). Next (third minor cycle), input signal 102(3) is compared to threshold 132(3), with the result stored in register 114(3). Next (fourth minor cycle), input signal 102(3) is stored in S/H circuit 106 when start conversion signal 122 is asserted. Next (fifth minor cycle), input signal 102(4) is compared to threshold 132(4), with the result stored in register 114(4). Finally, for the sixth minor cycle, the value in S/H circuit 106 is compared to a value in SAR 134, with the result provided to SAR logic 120.

Thus as an example for this major cycle, if a ten bit conversion is required (given SAR 134 and DAC 110 has a ten bit capability), ten major cycles would be required to complete the A/D conversion. For each major cycle, all of the threshold comparison results (i.e., results from minor cycles 1–3 and 5) are stored in register 114 and a single bit of the AD conversion is developed.

As described herein, cycling logic 118 may sequence through the desired input signals 102 for comparison purposes, but when a successive approximation A/D conversion is desired (i.e., based on the assertion of start conversion signal 122), the comparison sequence is interrupted and the A/D conversion is completed prior to returning to the comparison sequence at the point where the sequence was interrupted. Alternatively, cycling logic 118 may sequence through the desired input signals 102 for comparison purposes, but when a successive approximation A/D conversion is desired, cycling logic 118 adds the successive approximation A/D conversion to the sequence. As discussed above, one or more bits of the A/D conversion may be developed for each pass through the complete sequence cycle of cycling logic 118.

Figure 2:
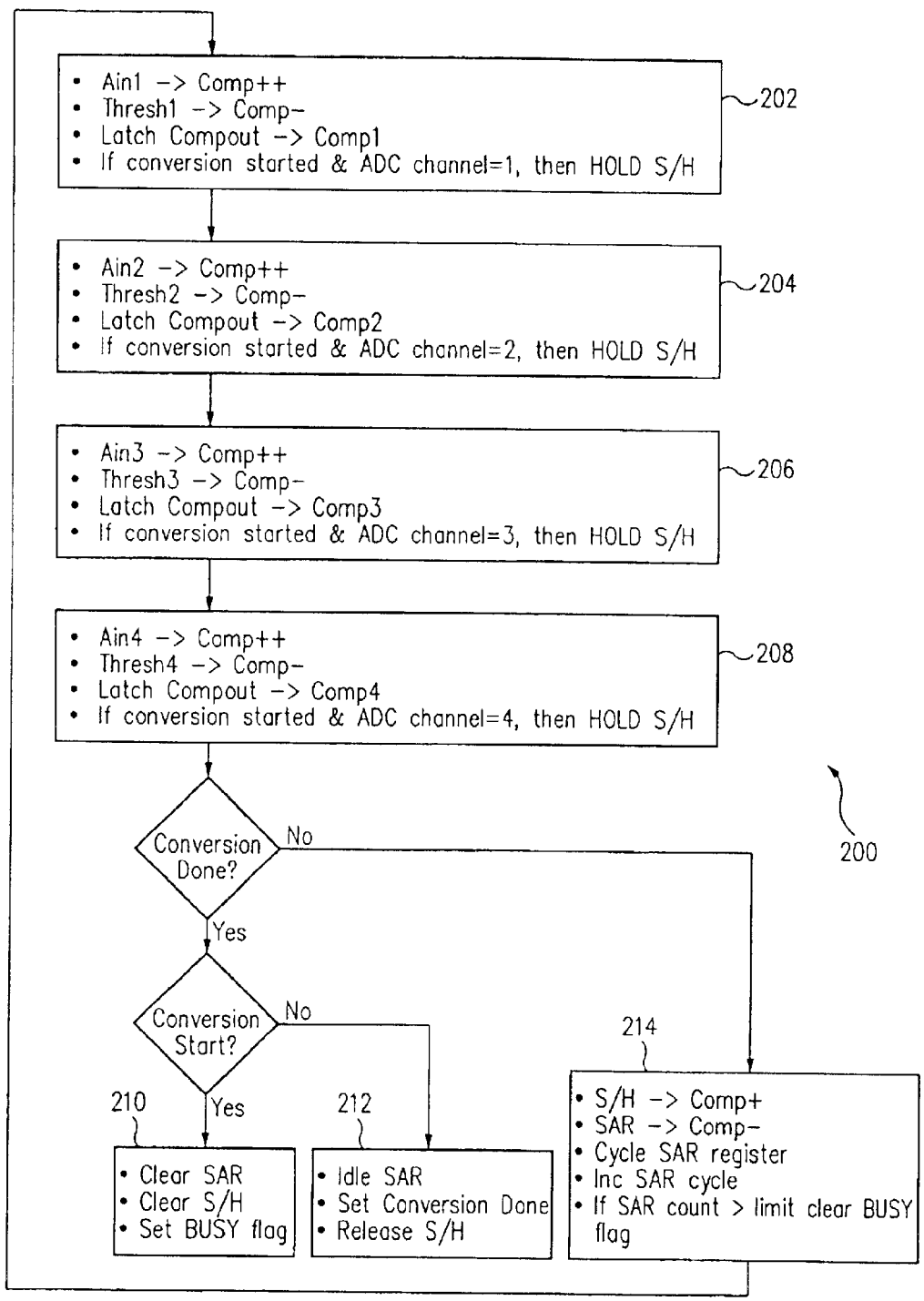
FIG. 2 shows an exemplary flowchart to illustrate operation of the circuit of FIG. 1.

FIG. 2 shows a flowchart 200 that illustrates an exemplary operation of circuit 100 and cycling logic 118 of FIG. 1 for four active input signals 102. Referring to FIGS. 1 and 2, in box 202 input signal 102 (Ain_1 or Ain1) is provided to the positive input terminal (Comp++) of comparator 112, the corresponding threshold 132 (Threshold_1 or Thresh1) is provided to the negative input terminal (Comp−) of comparator 112, the result (Compout) from comparator 112 is stored in a location (Comp_1 or Comp1) of register 114, and a check is made to determine if an A/D conversion is requested and if the desired signal for conversion is input signal 102 (i.e., Ain1). If input signal 102 (Ain1) is providing the desired signal for conversion, then this signal is sampled and held in S/H circuit 106. This process repeats for input signal 102 (Ain_2 or Ain2) in box 204, for input signal 102 (Ain_3 or Ain3) in box 206, and for input signal 102 (Ain_4 or Ain4) in box 208.

A check is made to determine if a successive approximation A/D conversion is in process and has been completed. If the conversion is done, a check is made to determine if a new conversion is desired and, if so, S/H circuit 106 is cleared, the old value in SAR 134 is cleared, and an AD conversion in progress flag (e.g., Busy flag) is set (box 210). If the conversion is done and prior to the start of a new conversion, conversion done signal 124 is asserted, S/H circuit 106 is cleared, and SAR 134 provides the result of the conversion via conversion result signal 126 (box 212).

If the conversion is not done, the value in S/H circuit 106 may be provided to comparator 112 and the value in SAR 134 may be provided to comparator 112 (box 214). In box 214 various other bookkeeping functions may be performed, such as incrementing the SAR cycle (counter), updating SAR 134 depending on the result of comparator 112, and clearing the A/D conversion in progress flag (e.g., Busy flag) if the successive approximation A/D conversion has been completed (depending upon the number of bits). Flowchart 200 is then repeated, with control returning to box 202 to start the next cycle.

In general, cycling logic 118 may evenly distribute its minor cycles among input signals 102 selected for threshold comparison operation and for one bit of the successive approximation A/D conversion per major cycle. Alternatively, one or more of input signals 102 selected for threshold comparison operations may be allocated one or more additional minor cycles so as to receive multiple threshold comparison operations (i.e., sampled or "hit" more than once during a major cycle) to effectively reduce the response time and increase the comparison frequency for these input signals 102. Also, one or more additional minor cycles may be allocated to the successive approximation A/D conversion to develop one or more additional bits of the successive approximation A/D conversion during a major cycle. Furthermore, one or more minor cycles may be utilized for calibration, such as for example to auto-zero comparator 112. Thus, cycling logic 118 is flexible (e.g., by implementation through programmable hardware or software) in its allocation of minor cycles to the signal channels (i.e., input signals 102) to maximize a desired performance for threshold comparisons of the individual input signals 102 and for successive approximation A/D conversion.

As explained herein, successive approximation A/D conversion may be performed to develop one or more bits during a minor cycle of a major cycle of cycling logic 118. For example, there may be twenty four minor cycles to perform threshold comparisons and one minor cycle to perform successive approximation A/D conversion for a major cycle. If each minor cycle is allowed 200 nanoseconds, the major cycle will take 5 microseconds (i.e., 25 minor cycles times 200 nanoseconds).

Figure 3:
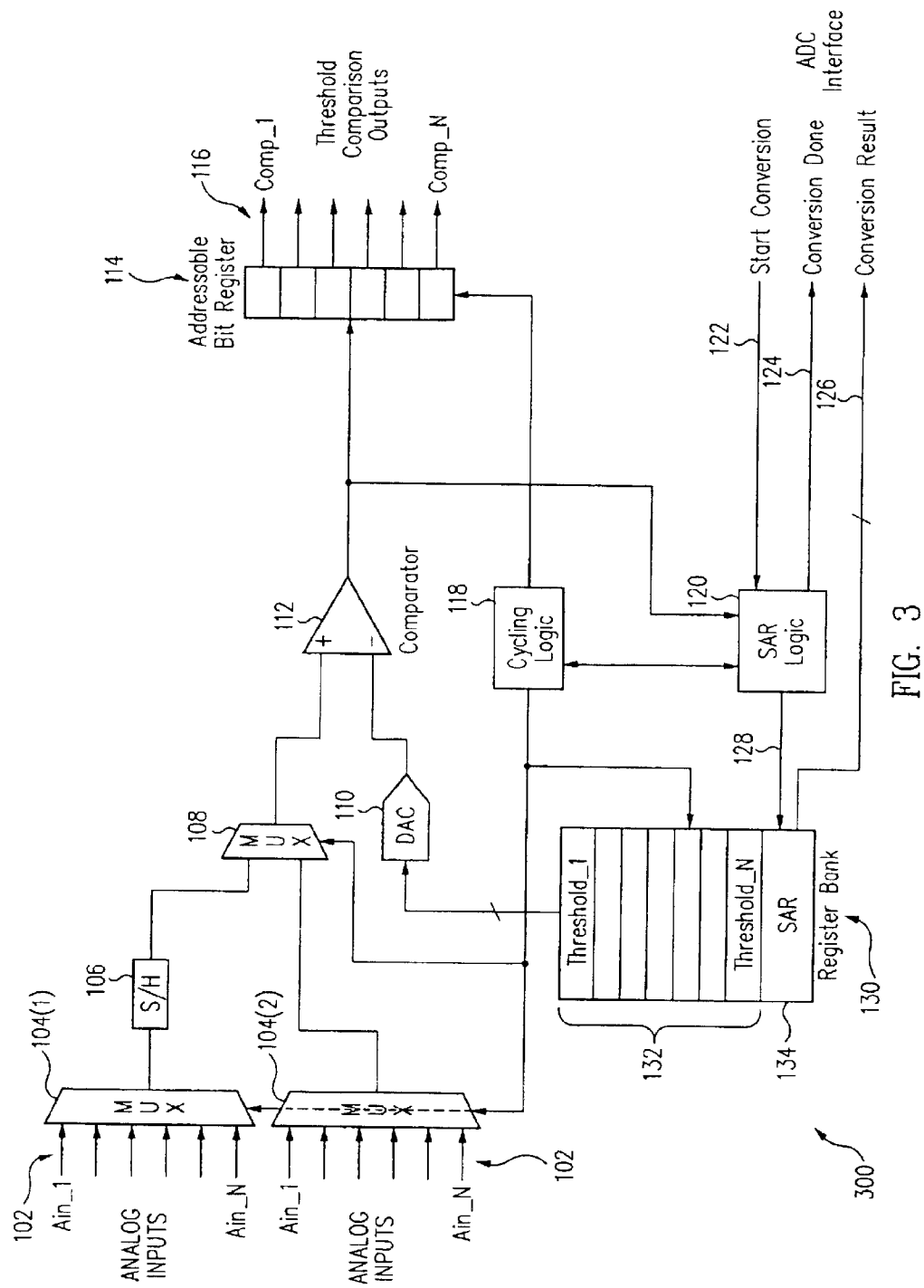
FIG. 3 shows a block diagram illustrating a circuit in accordance with an embodiment of the present invention.

If S/H circuit 106 does not (or cannot be implemented to) operate fast enough to capture one of input signals 102, such as during the duration of a minor cycle (e.g., 200 nanoseconds) of a major cycle, FIG. 3 shows a block diagram illustrating a circuit 300, in accordance with an embodiment of the present invention, to overcome certain of these potential limitations of S/H circuit 106. Circuit 300 is similar to circuit 100, but includes an additional multiplexer 104. By having input signals 102 available at multiplexers 104 (i.e., multiplexer 104(1) and 104(2)), S/H circuit 106 may be provided with additional time to sample and store the desired input signal 102 via multiplexer 104(1) for A/D conversion and not be constrained by the minor cycle time limits. Multiplexer 104(2) may then be employed to select input signals 102 for threshold comparison purposes.

Embodiments described above illustrate but do not limit the invention. It should also be understood that numerous modifications and variations are possible in accordance with the principles of the present invention. Accordingly, the scope of the invention is defined only by the following claims.

I claim:
1. A circuit comprising:
  a comparator adapted to receive a first and a second input signal and provide a comparator output signal;
  a first register adapted to store at least one threshold value and at least one successive approximation register value;
  a digital-to-analog converter adapted to provide the second input signal to the comparator, where the second input signal is based on one of the threshold values or one of the successive approximation register values from the first register;
  a first multiplexer adapted to select from one or more input signals to provide a first output signal;
  a sample and hold circuit adapted to store a value of the first output signal and provide a second output signal; and
  a second multiplexer adapted to select between the first and second output signal to provide the first input signal to the comparator; and
  a second register adapted to store the comparator output signal from the comparator, wherein the circuit is adapted to provide threshold detection or successive approximation analog-to-digital conversion of the first input signal.

2. The circuit of claim 1, further comprising cycling logic adapted to control the first and second multiplexers to select the first input signal, from among a number of input signals, to provide to the comparator.

3. The circuit of claim 2, wherein the cycling logic is further adapted to select the threshold value or the successive approximation register value to provide as the second input signal to the comparator.

4. The circuit of claim 2, wherein the cycling logic is further adapted to select a location in the second register to store the comparator output signal.

5. The circuit of claim 1, further comprising successive approximation register logic adapted to control a value for the at least one successive approximation register value based on the comparator output signal.

6. The circuit of claim 1, wherein the comparator output signals stored in the second register provide the results from threshold detection operations of the comparator.

7. The circuit of claim 1, wherein the successive approximation register value is a result of an analog-to-digital conversion upon completion of a successive approximation analog-to-digital conversion operation by the circuit.

8. The circuit of claim 1, wherein the first register comprises a register bank of at least two registers, with one register adapted to store at least a threshold value and the other register adapted to store at least a successive approximation register value.

9. A circuit comprising:
 a comparator adapted to receive a first and a second input signal and provide a comparator output signal;
 means for providing the first input signal to the comparator, wherein providing includes selecting one from among a number of input signals to provide as the first input signal, with at least one of the input signals being selectively sampled and held and selectively provided as the first input signal; and
 means for storing and selecting one from a number of threshold values and one or more successive approximation register values to generate the second input signal to the comparator.

10. The circuit of claim 9, further comprising means for storing comparator output signals to provide as comparison results.

11. The circuit of claim 9, further comprising means for updating one of the successive approximation register values based on the comparator output signal to provide successive approximation analog-to-digital conversion.

12. The circuit of claim 9, further comprising means for cycling through the input signals to provide comparator results and/or successive approximation analog-to-digital conversion.

13. A method of providing analog-to-digital conversion and threshold detection, the method comprising:
 receiving a number of input signals, wherein at least one of the input signals is selectively sampled and stored;
 providing a first input signal selected from the input signals, including the at least one sampled and stored input signal;
 selecting a threshold value or a successive approximation register value to convert and provide as a second input signal;
 comparing the first input signal to the second input signal to provide a comparator output signal;
 providing the comparator output signal as a threshold detector result if one of the threshold values was selected; and
 providing the comparator output signal as a comparison result for successive approximation analog-to-digital conversion if the successive approximation register value was selected.

14. The method of claim 13, wherein the comparison result is used to update the successive approximation register value for successive approximation analog-to-digital conversion.

15. The method of claim 13, further comprising storing the threshold detector results and providing as threshold comparison output signals.

\* \* \* \* \*